United States Patent [19]

Iinuma

[11] Patent Number: 4,534,055
[45] Date of Patent: Aug. 6, 1985

[54] CODE CONVERSION SYSTEM

[75] Inventor: Kazumoto Iinuma, Tokyo, Japan

[73] Assignee: Nippon Electric Co., Ltd., Tokyo, Japan

[21] Appl. No.: 550,946

[22] Filed: Nov. 14, 1983

Related U.S. Application Data

[63] Continuation of Ser. No. 288,013, Jul. 29, 1981, abandoned.

[30] Foreign Application Priority Data

| Aug. 4, 1980 | [JP] | Japan | 55-106926 |
| Aug. 4, 1980 | [JP] | Japan | 55-106927 |
| Aug. 4, 1980 | [JP] | Japan | 55-106928 |
| Aug. 4, 1980 | [JP] | Japan | 55-106929 |
| Aug. 4, 1980 | [JP] | Japan | 55-106930 |

[51] Int. Cl.³ ............................................. G10L 1/00
[52] U.S. Cl. ...................................................... 381/34
[58] Field of Search .................................... 381/29–40; 364/513, 513.5; 340/347 DD; 370/92, 118

[56] References Cited

U.S. PATENT DOCUMENTS

| 4,053,930 | 11/1977 | Ogawa | 358/260 |
| 4,121,259 | 10/1978 | Preuss et al. | 358/261 |
| 4,136,363 | 1/1979 | Saran | 358/260 |
| 4,270,148 | 5/1981 | Adachi | 358/260 |

Primary Examiner—E. S Matt Kemeny
Attorney, Agent, or Firm—Blakely, Sokoloff, Taylor & Zafman

[57] ABSTRACT

In a code conversion system comprising an encoder and a decoder in combination, the encoder comprises an input terminal for receiving a multi-level time series signal having at least three signal levels subject to a variation of occurrence frequency of levels, a circuit for detecting the highest occurrence frequency signal ("HOFS") level of said multi-level time series signal and generating a first code representative of the run-lengths of said HOFS level, a circuit for generating a second code representative of the individual levels of said multi-level time series signal, and a circuit for combining said codes from said first and second code generation circuits on the time series, and wherein the decoder comprises a circuit for separating the first and second codes and decoding the separated first and second codes into the original multi-level time series signal.

6 Claims, 16 Drawing Figures

FIG.3

| SIGNAL LEVEL | V CODE GROUP | | |
|---|---|---|---|
| | CODE ABBREVIATION | CODE PATTERN | CODE LENGTH |
| 0 | $V_0^*$ | 1 1 | 2 |
| 0 | $V_0$ | 0 1 0 1 | 4 |
| 1 | $V_1$ | 1 0 | 2 |
| 2 | $V_2$ | 0 1 1 | 3 |
| 3 | $V_3$ | 0 1 0 0 | 4 |
| 4 | $V_4$ | 0 0 1 1 | 4 |
| 5 | $V_5$ | 0 0 1 0 | 4 |

FIG.4

| RUN-LENGTH | R CODE GROUP | | |
|---|---|---|---|
| | CODE ABBREVIATION | CODE PATTERN | CODE LENGTH |
| 0 | $R_0^*$ | 1 1 1 | 3 |
| 1 | $R_1^*$ | 1 0 | 2 |
| 2 | $R_2^*$ | 1 1 0 | 3 |
| 3 | $R_3^*$ | 0 1 1 1 | 4 |
| 4 | $R_4^*$ | 0 1 1 0 | 4 |
| 5 | $R_5^*$ | 0 1 0 1 | 4 |
| 6 | $R_6^*$ | 0 0 1 1 | 4 |
| 7 | $R_7^*$ | 0 0 1 0 | 4 |
| 8 | $R_8^*$ | 0 0 0 1 | 4 |

FIG.10

| $I_1$ | $I_2$ | $I_3$ | $I_4$ | $I_5$ | $I_6$ | $I_7$ | $I_8$ | $S_P$ |
|---|---|---|---|---|---|---|---|---|
| 0 | 0 | 0 | 0 | 1 | × | × | × | 0 |
| × | 0 | 0 | 0 | 0 | 1 | × | × | 1 |
| × | × | 0 | 0 | 0 | 0 | 1 | × | 2 |
| × | × | × | 0 | 0 | 0 | 0 | 1 | 3 |
| REMAINDER ||||||||| 15 |

CODE CONVERSION SYSTEM

This is a continuation of application Ser. No. 288,013, filed July 29, 1981, now abandoned.

BACKGROUND OF THE INVENTION

This invention relates generally to a code conversion system which effects compressed encoding of a sampled multi-level time series signal subject to a variation of occurrence frequency of levels and decoding of the same.

The multi-level time series signal which is obtained by sampling a video or voice signal generally involves a variation of occurrence frequency of the individual multi-levels.

The pulse code modulation (PCM) signal which is obtained by A/D conversion of an analog video signal or voice signal has no appreciably large variation of occurrence frequency, whereas the multi-level signal which is obtained by converting a PCM signal into a differential pulse code modulation (DPCM) signal generally exhibits an occurrence frequency distribution of the zero-concentrated form, namely a form in which signals having differential levels approximating 0 (zero) occur at a high occurrence frequency and signals having large differential levels occur at a low occurence frequency. The signal having such a variation of occurrence frequency as described above can be subjected to compressed coding by the variable length coding which allocates short length codes to signals involving high occurrence frequency and long length codes to signals involving low occurrence frequency. This variable length coding is a method which gives to the sampled multi-level differential time series signal such variable length codes as are predetermined in accordance with differential signals existing at individual sampling times. In this case, at least one bit of code is required for the differential level of the highest occurrence frequency. In an interframe DPCM coding to be effected on video signals such as for television, however, it is usual that the probability of the occurrence of signals having a zero differential level reaches 90% or more. Thus, allocating the one-bit code to the signals of the zero differential level proves to be inefficient. An attempt has been made, therefore, to improve the compression efficiency as by dividing the time series signal subject to a heavy variation of occurrence frequency into unit blocks each containing eight sampled levels, for example, and assigning a special code to a unit block in which all the eight signal levels have the highest occurrence frequency (hereinafter referred to as "highest occurrence frequency signal levels"). This approach, however, has a disadvantage that the compression efficiency is not so improved for the complexity of system configuration inevitably entailed.

SUMMARY OF THE INVENTION

An object of this invention is to provide a simplified code conversion system which is free from the disadvantages described above and permits multi-level time series signals, which are quantized to N levels, N being equal to or greater than 3, subject to a variation of occurrence frequency of levels to be encoded or decoded efficiently. The multi-level signal is then encoded for the run lengths of the highest occurrence frequency ("HOFS") signal level, the signal levels of the individual levels, and transitions from run length coding to signal level coding and signal level coding to run length coding.

Broadly, according to the present invention, in a code conversion system comprising an encoder and a decoder in combination, the encoder comprises an input terminal for receiving a binary-coded multi-level time series signal subject to a variation of occurrence frequency of levels, means for detecting "HOFS" levels of said multi-level time series signal and generating a first code representative of the run-length of said "HOFS" levels, means for generating a second code representative of the individual levels of said multi-level time series signal, and means for combining said codes from said first and second code generation means on the time series. Both the first and second codes are generated by a variable length coding technique (e.g. Huffman). The decoder comprises means for separating the first and second codes and decoding the separated first and second codes into the original multi-level time series signal.

In the present invention, since the level of the highest occurrence frequency in the multi-level time series signal is designated by a code indicative of the run-length of the highest occurrence frequency level, it is possible to reduce the number of code bits per one sampled level to less than 1 bit. Further since two kinds of codes, one for the level and the other for the run-length, contain a code indicative of transition, the level of the highest occurrence frequency can be discriminated from the other levels even when all the levels are disordered on the time series and, consequently, the compressed coding can be effected with ease, thus providing a circuit arrangement of high compression efficiency and high simplicity.

BRIEF DESCRIPTION OF THE DRAWINGS

FIGS. 3 and 4 are diagrams illustrating exemplary patterns of first and second codes used in this invention;

FIG. 10 is a waveform diagram useful to explain the operation of the bit arrangement converter circuit;

DESCRIPTION OF THE PREFERRED EMBODIMENTS

Typically, in a code conversion system, a multi-level time series signal is converted into a compressed code in an encoder and transmitted through a transmission line to a decoder for decoding of the compressed code, or the compressed code is once stored in a memory and read out directly by the decoder.

Figure 1:
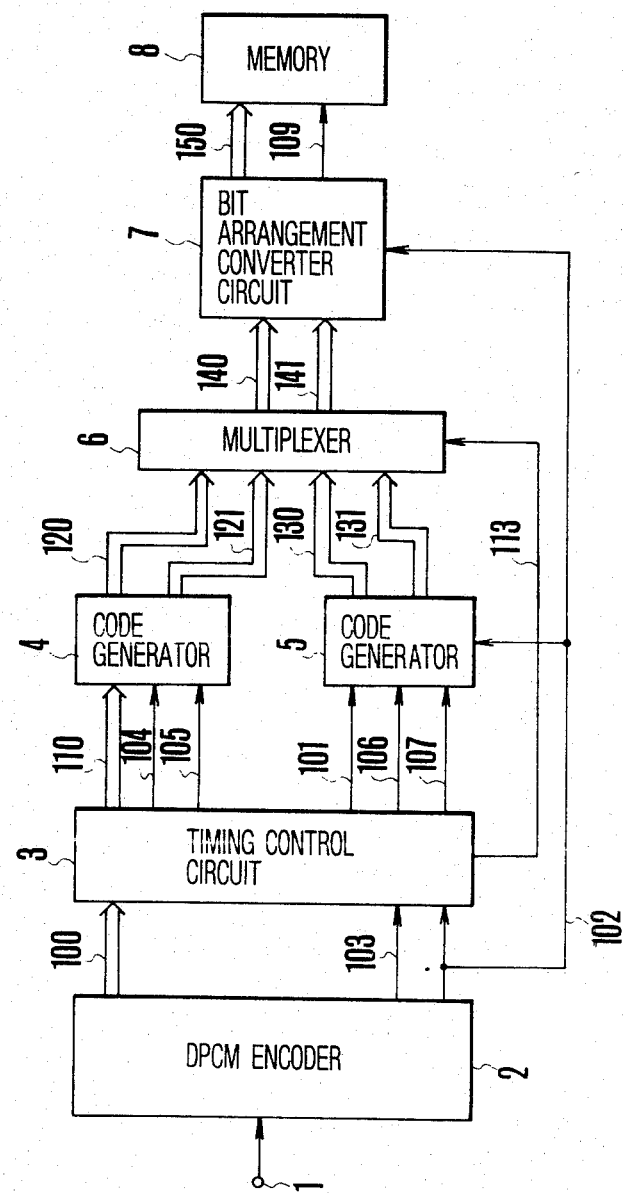
FIG. 1 is a block diagram illustrating an encoder used in a code conversion system embodying the invention.
Figure 2:
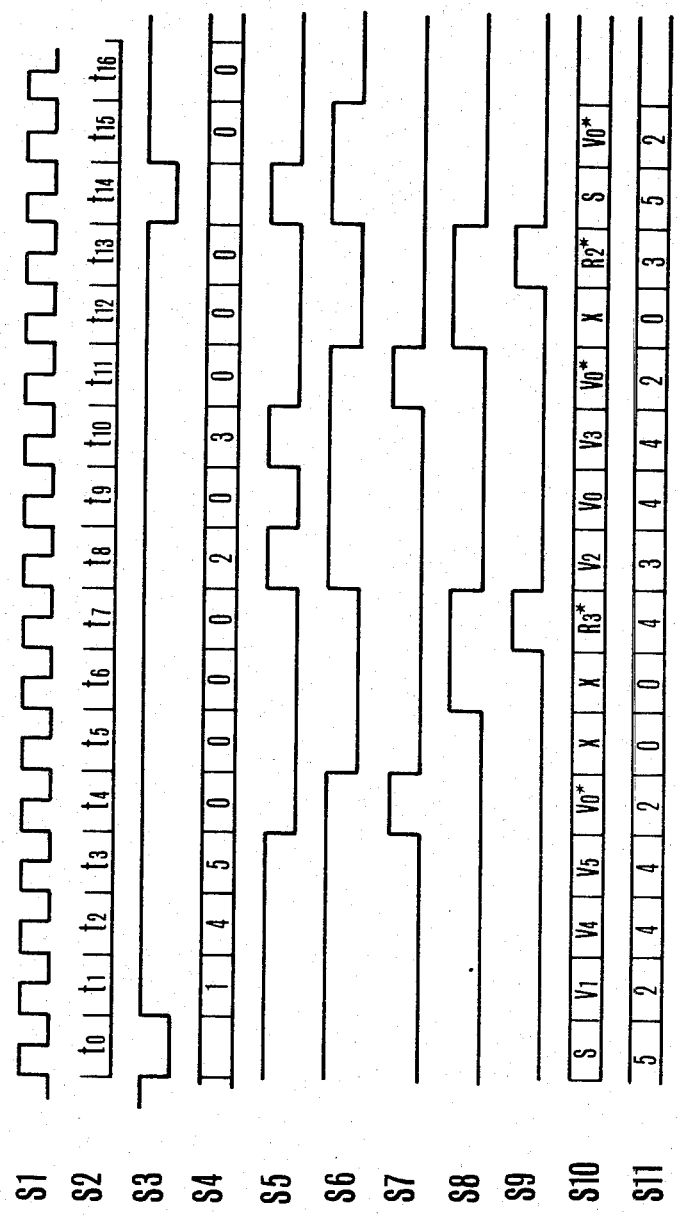
FIG. 2 is a waveform diagram useful to explain the control timing involved in the operation of the encoder.

FIG. 1 illustrates one preferred embodiment of an encoder used in a code conversion system of the present invention and FIG. 2 illustrates a timing chart of the operation of the encoder.

The system of this invention can be applied to the sampled time series signals such as video signals or voice signals. Here, for the sake of explanation, the system will be described as applied to television signals. First, a television signal fed to an input terminal 1 is converted in a DPCM encoder 2 into a multi-level time series signal (S4 in FIG. 2) subject to a variation of occurrence frequency which is adapted for the conversion system of this invention and then delivered to a signal line 100. At the same time, a synchronization timing signal (S3 in FIG. 2) and a sampling clock pulse (S1 in FIG. 2) are simultaneously issued to signal lines 103 and 102, respectively. Although the synchronization timing signal S3 is not always indispensable for this invention, it is used as information indicating boundaries of blocks by which the time series data is divided into a data of a predetermined length for facilitation of compressed coding of the data. The encoder of this invention as illustrated in FIG. 1 comprises a timing control circuit 3, a first code generator 5 for generating first codes (hereinafter referred to as "R codes"), a second code generator 4 for generating second codes (hereinafter referred to as "V codes"), a multiplexer 6 for coordinating the first and second codes, and a bit arrangement converter circuit 7 for arranging variable length codes in the order of their occurrence and converting them into a data of parallel 1 bits. Reference numeral 8 denotes a memory for storing the data which have been converted by the encoder of the present invention.

When the encoder of this invention is used as incorporated in a telecommunication system through service lines, the memory 8 functions as a buffer memory for smoothing data speed so that the contents of the memory are read out parallelly at a speed of 1/1 of the service line speed, converted into serial codes, and issued to the lines. When the encoder of this invention is used as part of the input means for a data file having a computer or the like, this memory 8 serves as a computer memory or a memory for interface. Here, the first code R denotes the run length of the highest frequency level on the time series and the second code V denotes the level of the multi-level signal. The R code and the V code each contain at least one transition code. They will be referred to respectively as the first transition code (hereinafter as "R* code") and the second transition code (hereinafter as "V* code"). The R* code indicates transition from the R code to the V code and, on the time series, causes a V code to be transmitted immediately after an R code. The V* code indicates transition from the V code to the R code and, on the time series, cause an R code to be transmitted immediately after a V code. For codes excepting the transition codes, an R code will be followed by another R code and a V code by another V code on the time series.

FIG. 3 illustrates an example of V codes for the multi-level signal of signal levels 0 to 5. To the signal level 0, namely, the highest frequency level, the code $V_0$ which causes no transition is given in addition to the transition code $V_0^*$.

The V codes are to be given variable length codes having code lengths of from 2 to 4 as shown in the diagram. The variable length codes possess such a characteristic that when the beginning of a code is known, the length of the code or the end of the code on the time series is known. With reference to FIG. 3, the codes which begin with "1", for example, are limited to the two codes, $V_0^*$ and $V_1$, having code patterns of "11" and "10" each of which has a code length of 2. The code which begins with "011", for example, is the code $V_2$ alone, having a code length of 3. The codes beginning with "00..." or "010..." invariably have a code length of 4.

FIG. 4 illustrates an example of R codes for the run lengths of the highest frequency signal levels. Here, unequal length codes having code lengths of 2 to 4 are assigned to the R codes. The codes which indicate run lengths of from 0 to 7 are $R_0^*$ through $R_7^*$ which are transition codes by nature. The code $R_8$ which indicates a run length of 8 is not a transition code. With the present invention, it is possible to have all the run length codes defined by transition codes. Generally, such a definition entails a disadvantage that as the run lengths gain in size, the kinds of codes used for indicating such run lengths increase so much as to complicate the circuits for the generation of codes. To avoid the trouble, therefore, the present invention adopts both the non-transition and transition codes as shown in FIG. 4 and permits encoding of large run lengths. By use of the non-transition code $R_8$, the run length 8, for example, can be expressed as $R_8 + R_0^*$ and the run length 10 as $R_8 + R_2^*$. With the code group as exemplified in FIG. 4, therefore, all the run lengths from 0 to 15 can be expressed by use of the nine codes indicated in the diagram. When additional non-transition codes are used as desired, it becomes possible to enable still larger run lengths to be expressed.

Determination of such variable length codes as shown in FIGS. 3 and 4 is actually accomplished by measuring signal levels and run lengths in the video signal of interest to find out statistically their occurrence frequencies and assigning Huffmann codes, for example, to the corresponding probability distribution. By adoption of such variable length codes, the entirety of the compressed code levels can be minimized.

Now the construction and operation of the component parts 3 to 7 of the encoder of this invention will be described in this order. For simplicity of description, it is assumed that the multi-level time series signals fed to the encoder is expressed by the six levels of 0 to 5, with the 0 level taken as the highest frequency signal level. Namely, the signal line 100 is formed of parallel three-bit data lines and the signal levels of 0 to 5 are expressed by binary digits such as 000, 001, . . . .

Figure 5:
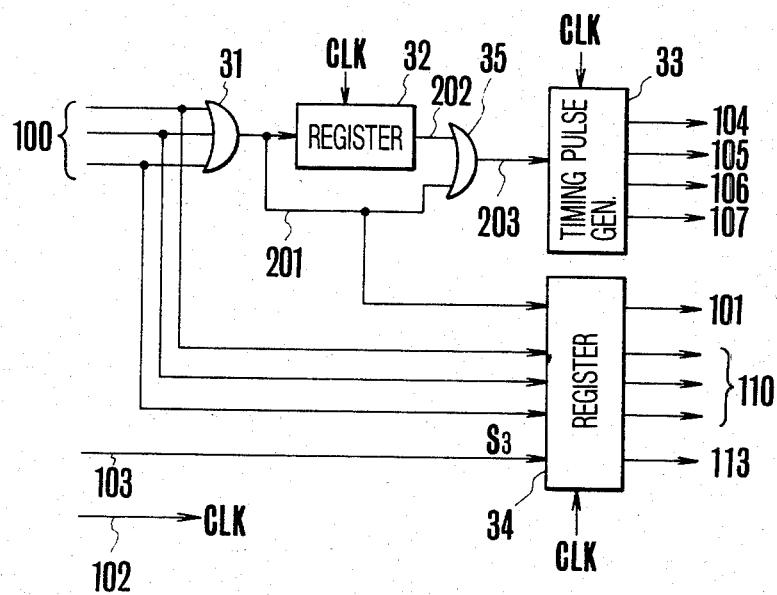
FIG. 5 is a block diagram illustrating an example of a timing control circuit contemplated by this invention.

FIG. 5 illustrates an example of the timing control circuit 3. In the figure, as the multi-level time series signal having levels of 0 to 5 is applied via the signal line 100, an OR circuit 31 judges whether or not the signal level is 0. The ORed signal is then sent to a register 34 via a signal line 201. Then, in the register 34 for delay adjustment, the signal undergoes delay adjustment and is delivered in the form of a highest occurrence frequency signal to a signal line 101 (S5 in FIG. 2). Specifically, in the embodiment illustrated in FIG. 2, it is assumed for the simplicity of description that input signals to be encoded are absent at times $t_0$ and $t_{14}$ of synchronization timing (during the blanking period of television signals, such a case devoid of encoding occurs frequently), and that the highest occurrence frequency signal takes "1" (high level) at times $t_0$ and $t_{14}$. The output from the OR gate 31 is delayed by one clock by a one-clock delay register 32 under the application of clock pulse CLK from the line 102 and delivered to an OR gate 35 via a signal line 202. In the OR gate 35, the signal just received and the original signal (not delayed) are ORed (S6 in FIG. 2) and the outcome is forwarded through a signal line 203 to a timing pulse generator 33 consisting of registers and gates. The timing pulse generator 33, by making use of the signal from the signal line 203 and the clock pulse CLK, produces the timing pulse for V code generation (S6 in FIG. 2), the timing pulse for transition code V* generation (S7 in FIG. 2), the timing pulse for R code generation (S8 in FIG. 2), and the timing pulse for transition code R* generation (S9 in FIG. 2) on signal lines 104 to 107, respectively. On the other hand, the multi-level time series signal S4 and the synchronization timing signal S3 are subjected to delay adjustment in the delay adjusting register 34 and are delivered respectively to signal lines 110 and 113. The register 34 for delay adjustment is used for the purpose of making up for the delay caused in consequence of the waveform treatment in the timing pulse generator 33. The timing pulses S6, S7, S8, and S9 depicted in FIG. 2 are represented by the states after the delay adjustment. The relationship between signals S1 through S9 is corrected as viewed from the output of the timing control circuit 3. Thus, the waveforms S3, S4, and S5 appear on the signal lines 113, 110, and 101.

The multi-level time series signals S4, the V code generating timing pulse S6, and the transition code V* generating timing pulse S7 which have been generated in the timing control circuit 3 are supplied to the second code generator 4 shown in FIG. 1. The second code generator 4, in response to the timing pulses, generates a V code on an output signal line 120 and a binary code indicating a code length of the V code on a signal line 121, as will be detailed later. The highest occurrence frequency signal S5, the R code generating timing pulse S8, and the transition code R* generation timing pulse S9 which have been generated in the timing control circuit 3 are supplied to the first code generator 5. The first code generator counts the number of 0's occurring consecutively in the highest occurrence frequency signal S5 and, in response to the timing pulses, generates an R code on an output signal line 130 and a binary code indicating a code length of the R code on a signal line 131, as will be detailed later. The operation of the second and first code generators is controlled by the timing pulses S6 and S8 so that the V and R codes will not be generated at the same time.

The V and R codes appearing on the signal lines 120 and 130 are subjected to time-sharing multiplexing in the multiplexer 6. Similarly, the binary codes indicating code lengths appearing on the signal lines 121 and 131 are subjected to time-sharing multiplexing in the multiplexer 6. Further the multiplexer 6 causes the synchronizing code S to be subjected to time-sharing multiplexing and added to the R and V codes in accordance with the synchronization timing pulses supplied through the signal line 113 and produces the resultant variable length codes M (S10 in FIG. 2) on a signal line 140. Also with respect to the binary code indicating the code length, the code lengths of R and V codes and of synchronizing code S are subjected to time-sharing multiplexing and the resultant code length signal N (S11 in FIG. 2) is produced on a signal line 141. Symbol X in S10 of FIG. 2 denotes an optional code and the fact that the effective code number in S11 of FIG. 2 is 0 indicates that no significant variable length code is present at that particular time.

Here, the combination of V and R codes in S10 of FIG. 2 will be described. In this example, the operation proceeds on the following rules.

(1) When the multi-level time series signal has levels other than highest occurrence frequency levels, codes $V_k(k=1$ to 5) devoid of transition are issued.

(2) When the level of the multi-level time series signal changes into the highest occurrence frequency level from that other than the highest occurrence frequency level, (a) the transition code $V_0^*$ is given to the first of the highest occurrence frequency levels if the second signal is also of the highest occurrence frequency level, and (b) the code $V_0$ devoid of transition is given to that first signal if the second signal is not of the highest occurrence frequency level.

(3) When two or more highest occurrence frequency levels occur consecutively, the run length of the consecutive highest occurrence frequency levels excepting the first level is represented by the R code.

(4) The R code is represented by one of the transition codes $R_1^*$ through $R_7^*$ when the run length falls in the range of from 1 to 7. When the run length falls in the range of from 8 to 15, however, the R code is represented by the combination of the non-transition codes $R_8$ and one of the transition codes $R_0^*$ through $R_7^*$.

(5) The first of the codes in each of the blocks is invariably a V code.

These rules will be referred to collectively as Rule 1.

Referring to FIG. 2, since the levels at the times $t_1$, $t_2$, $t_3$, $t_8$, $t_{10}$ are not of the highest occurrence frequency level, $V_k$ codes are allotted to these levels as shown in S10 of FIG. 2 in accordance with (1) of Rule 1. At times $t_4$ and $t_{11}$, transition codes $V_0^*$ are alloted in accordance with (2), (a) of Rule 1. And at time $t_0$, a non-transition code $V_0$ is allotted in accordance with (2), (b) of Rule 1. The signals of the highest occurrence frequency level at the time $t_5$ through $t_7$ are represented by a $R_3^*$ code indicating a run length of 3 in accordance with (3) and (4) of Rule 1. This code is issued at time $t_7$ as indicated in S10 of FIG. 2. This applies to times $t_{12}$ and $t_{13}$. In the case of a run length in excess of 8, which is not shown in FIG. 2, a transition code is issued at the time of the last of the highest occurrence frequency level signals and a non-transition code is issued one clock before that time. At times $t_1$ and $t_{15}$ which correspond to the first of the codes in the respective blocks, V codes are allotted in accordance with (5) of Rule 1. When the first of the codes in a given block happens to have the highest occurrence frequency level as in the case of the code at the time $t_{15}$, the $V_0^*$ code is alloted if the code at time $t_{16}$ is of the highest occurrence frequency level or otherwise the $V_0$ code is allotted.

Figure 6:
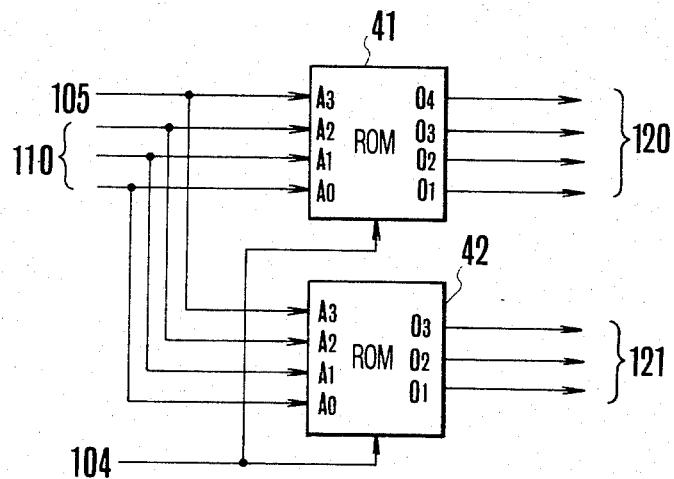
FIGS. 6 and 7 are block diagrams illustrating examples of second and first code generators.

FIG. 6 illustrates an example of the second code generator. In the figure, the multi-level time series signal S1 is supplied through the signal line 110 to address input terminals $A_2$ to $A_0$ of read only memories (ROMs) 41 and 42. The transition code generation timing pulse S7 is supplied through the signal line 105 to an address input terminal $A_3$ of the ROMs 41 and 42. The timing pulse is supplied through the signal line 104 to output control terminals (such as chip selects) of the ROMs 41 and 42. When the output control terminals are turned off, all the outputs from the ROMs 41 and 42 are changed to 0. Only when the timing pulse is ON, the contents designated by the address lines are issued to the output signal lines 120 and 121. The contents of the ROMs 41 and 42 are readily prepared based on FIG. 3. By assuming that $A_0$, $A_1$, ... denote the address lines of $2^0$, $2^1$, ..., the code patterns of the codes $V_0$ through $V_5$ are written in the addresses 0 through 5 of the ROM 41 and the corresponding code lengths represented by binary digits are written in the corresponding addresses of the ROM 42. The $V_0^*$ code pattern and the binary code "010" on the output terminals $0_3$, $0_2$ and $0_1$ indicating the code length of 2 are written in eighth addresses of the ROMs 41 and 42, respectively. The code patterns are written in so that the first-bit code always occurs on the output terminal $0_4$, for example, of the ROM 41. When the code is of two bits, the remaining two bits may be 0 or 1. If these two bits are represented by X, the $V_0^*$ code pattern written in the eight addresses is issued in the form of "11XX" at the output terminals $0_4$ through $0_1$ in the order mentioned.

Figure 7:
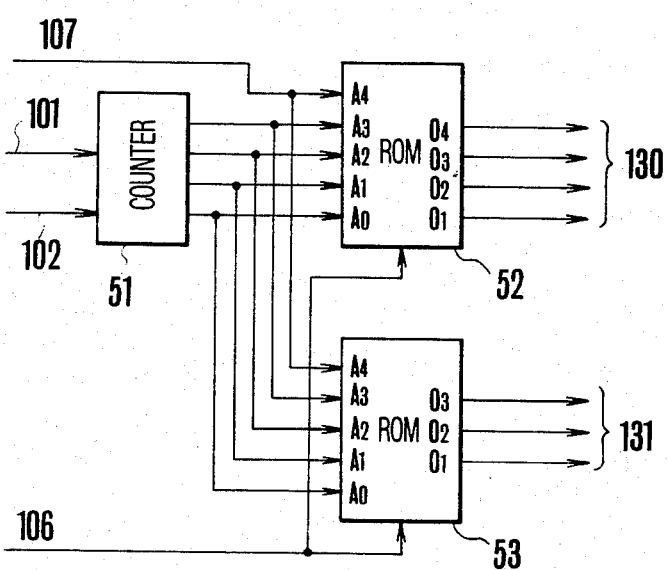

FIG. 7 illustrates an example of the first code generator. The signal of highest occurrence frequency level supplied through the signal line 101 is applied to a clear terminal of a counter 51. The clock pulse supplied through the signal line 102 is applied to a clock input terminal of the counter 51, which keeps count of clock pulses to be received during a period through which the highest occurrence frequency signal is "0". The counter is cleared when the highest occurrence frequency signal becomes "1". The output from the counter 51 is applied to address input terminals $A_3$ and $A_0$ of ROMs 52 and 53.

Similarly to the second code generator, the transition code output timing pulse is supplied through the signal line 107 to address lines $A_4$ of the ROMs 52 and 53, and the R code output timing pulse is supplied through the signal line 106 to the output control terminal of the ROMs 52 and 53. The ROMs 52 and 53 issue an R code and a code length corresponding to a run length when the output control terminals are ON. All the outputs are rendered "0" when the output control terminals are turned ON. Obviously, the contents of the ROMs 52 and 53 can be determined based on the information given in FIG. 4 similarly to the second code generator.

Figure 8A:
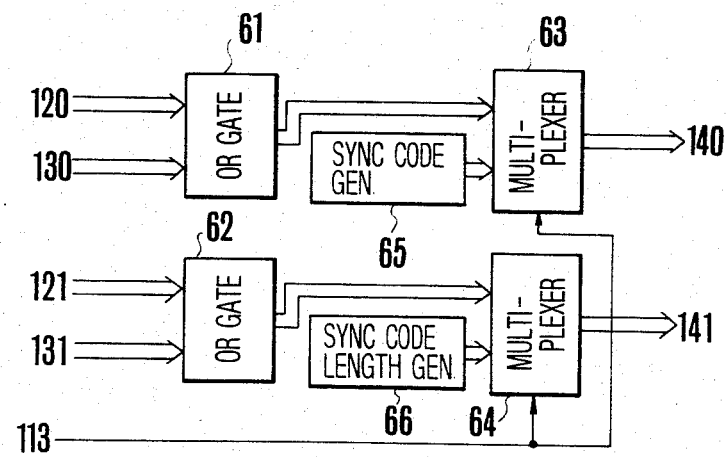
FIG. 8A is a block diagram illustrating an example of a multiplexer.

FIG. 8A illustrates an example of the multiplexer circuit 6. The V and R codes which are supplied respectively through the signal lines 120 and 130 are subjected to time-sharing multiplexing in an OR gate 61. Further, the synchronizing signal S is similarly multiplexed in the multiplexer 63. Consequently, the variable code M is issued to the output terminal 140. A sync code generator 65 serves to generate the synchronizing signal S. In the illustrated embodiment, the synchronizing signal S is in the form of a five-bit code represented as "00001". Since the synchronizing signal S is indicative of the beginning of the codes contained in each of the blocks, the code pattern for this synchronizing signal is required to differ from all the code patterns derived from the combination of V and R codes indicated in FIGS. 3 and 4. The code "00001" adopted in the illustrated embodiment represents a pattern which is never derived from the combination of V and R codes indicated herein as described above. A multiplexer 63 switches the two input signals in response to the synchronization timing pulse supplied through the signal line 113 and issues the synchronizing signal S when the synchronization timing pulse is 0. The same multiplexing is carried out on the code length signal indicative of the length of the relevant code. Reference numeral 62 denotes an OR gate and 64 a multiplexer. The code length signal N resulting from the time-sharing multiplexing is issued on the signal line 141. A sync code length generator 66 generates a code pattern "101" l since the synchronizing code S has a code length of 5.

Now, the bit arrangement converter circuit 7 will be described. The bit arrangement converter circuit 7 serves to extract from an arrangement of variable codes including invalid codes only effective variable codes designated by n (the number of shiftings to be described later), thus effecting necessary arrangement conversion.

Figure 9:
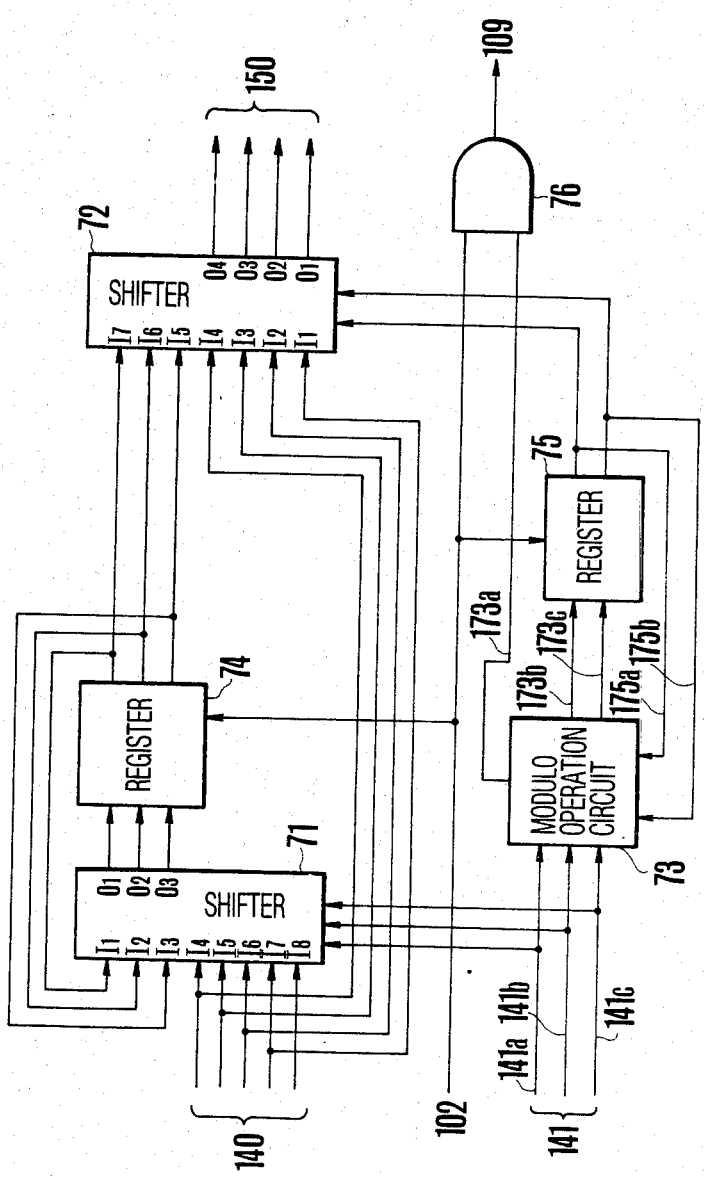
FIG. 9 is a block diagram illustrating an example of a bit arrangement converter circuit.
Figure 10:
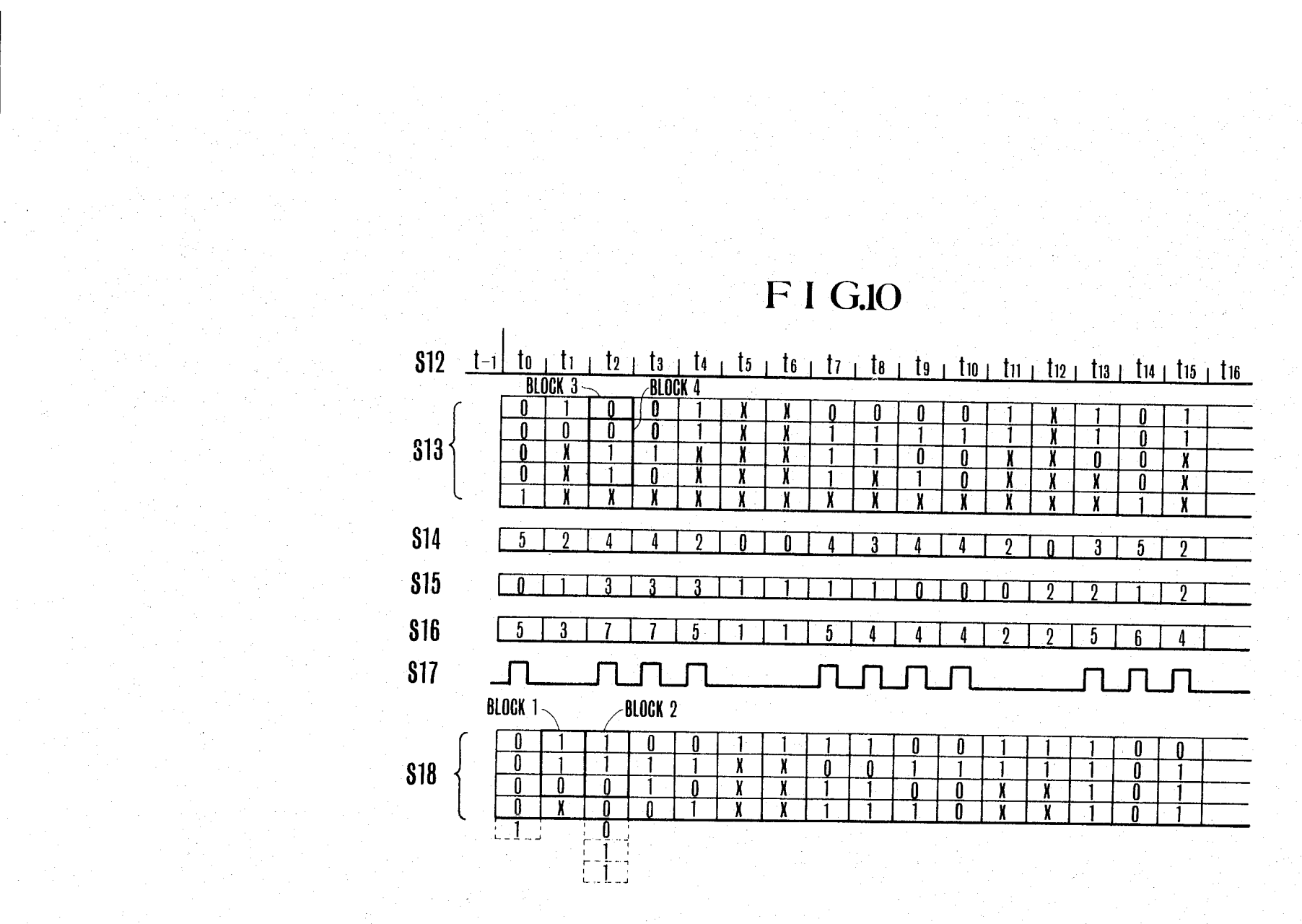

FIG. 9 illustrates an example of the bit arrangement converter circuit and FIG. 10 illustrates waveforms in the circuit of FIG. 9. The input signal to the converter circuit 7 includes the variable length code M supplied via the signal line 140 (S13 in FIG. 10), the code length signal N indicative of the length of the variable length code supplied via the 3-bit signal line 141 (S14 in FIG. 10), and the sampling clock pulse supplied via the signal line 102. The code length of the variable length code is 2, 3, 4, or 5 as clear from FIGS. 2, 3 and 4. The code length is given as 0 where not a single significant variable length code is present. The five-bit code fed from the signal line 140, therefore, contains both valid and invalid codes. For example, in the case of a variable length code having a code length of 2, only the two-upper bit code of the signal on the signal line 140 is valid and the remaining three-bit code is invalid. It suffices for the converter circuit to eliminate the invalid code X from the variable length code M and extract the valid variable length code. Where the sampling frequency is low in the range of from severals of tens to severals of hundreds of KHz, such conversion of the arrangement of variable length code may conveniently be carried out after the variable code has been converted into train of one-bit signals through parallel/serial conversion. Where the sampling frequency is high and of the order of 10 MHz, for example, this parallel/serial conversion may prove difficult because the speed of the serial operation reaches the order of 100 MHz. The variable bit arrangement converter circuit illustrated in FIG. 9 is a parallel-operation circuit designed to overcome the drawback mentioned above. This circuit can operate at a high speed. Specifically, this circuit serves to remove the invalid code from the variable code M including the invalid code, condense the remaining bits, and thereafter issue the output in the form of parallel 4-bit data to an output line 150. This circuit may be called a parallel-operation variable bit arrangement converter circuit. The parallel-operation variable bit arrangement converter circuit can be generalized as a circuit that is capable of removing the invalid code from the variable length code of parallel m bits including such an invalid code for the purpose of converting the m-bit parallel code into l-bit parallel data.

Now, the operation of circuit illustrated in FIG. 9 will be described. This circuit is represented on the assumption that m=5 and l=4. The 5-bit variable length code fed through the signal line 140 is applied to first and second shifters 71 and 72. The shifter is a kind of multiplexer serving to switch the connection between input and output lines. For example, a circuit device such as Am 25S10 made by Advanced Micro Device Corp. may be adopted as the shifter. The first shifter 71 has input terminals $I_1$ to $I_8$ and output terminals $O_1$ to $O_3$, and the connection of the input terminals is determined by the number of shiftings which depends on signals on signal lines 141a to 141c. More particularly, the connection is made between $I_1$ and $O_1$, $I_2$ and $O_2$, and $I_3$ and $O_3$ when the shift number is 0. The connection is made between $I_2$ and $O_1$, $I_3$ and $O_2$, $I_4$ and $O_3$ when the shift number is 1. The general rule is that the connection is established between $I_{1+n}$ and $O_1$, $I_{2+n}$ and $O_2$, and $I_{3+n}$ and $O_3$ when the shift number is n. Although the second shifter 72 has four output terminals $O_1$ to $O_4$, its operation for the connection between input and output terminals is similar to that of the first shifter 71. The output terminals $O_1$ to $O_3$ of the first shifter 71 are connected to the input terminals of a register 74 and output terminals of the register 74 are connected to the input terminals $I_1$ to $I_3$ of the first shifter 71 and input terminals $I_7$ to $I_5$ of the second shifter. To the output terminals $O_4$ to $O_1$ of the second shifter 72 are delivered the 4-bit parallel code freed from the invalid code. A surplus code which arises when the variable length code is divided into blocks each of 4 bits are temporarily stored in the register 74. The number of such surplus code bits, on the other hand, is calculated by a modulo-operation circuit 73 and a register 75. The modulo-operation circuit 73 adds the binary data indicative of the code length of variable length code fed through signal lines 141a to 141c and the binary data indicative of the surplus number fed through signal lines 175a and 175b, supplies the residue of the division of the sum of the addition by l via signal lines 173b and 173c to a register 75, and when the sum of the addition exceeds l, supplies a carrier signal via a signal line 173a to an AND gate 76. In the illustrated embodiment, since l=4, an ordinary binary adder may be used as the modulo-operation circuit. The AND gate 76 produces a write pulse which causes output data to be written in the memory when the carrier signal is issued.

Now the operation of the converter circuit will be described with reference to FIG. 10. For the sake of simplicity, it is assumed that the output (surplus number) of the register 75 at time $t_0$ is 0. In other words, the assumption is such that no surplus code is generated and stored in the register 74 at a time $t_{-1}$ preceding the time $t_0$ by one time slot. The surplus number is indicated by a signal S15 in FIG. 10. The sum of the addition of code length S14 of the variable code and the surplus number S15 is indicated by a signal S16. At the time $t_0$, the variable length code is in the form of a 5-bit information "00001" as indicated by the signal S13. Since this code consists of more than four bits, the first four bits, namely "0000" are transferred to the terminals $O_4$ to $O_1$ of the shifter 72. The modulo-operation circuit 73 performs the addition of the surplus number 0 and the code length 5. In this case, since the sum of the addition is 5, a carrier signal "1" is fed to the signal line 173a and a binary "01" representative of a surplus number of 1 corresponding to a surplus code "1" is issued to the signal lines 173b and 173c. Consequently, a write pulse as indicated at a signal S17 is generated at the time $t_0$ and is applied to the memory 8 via a signal line 109 so that the output data "0000" of the shifter 72 is written in the memory as indicated at a signal S18. The 1-bit code which has occurred as a surplus at the time $t_0$ is transferred from the input terminal $I_3$ of the shifter 71 to the output terminal $O_3$ and then is received into the register 74. This 1-bit surplus code, illustrated at S18 in FIG. 10 as surrounded by dotted lines for convenience, signifies a surplus number of 1 at time $t_1$. At the time $t_1$, since the variable length code is in the form of a 2-bit data "10" and the preceding surplus code is in the form of 1-bit data, the 4-bit data for entry in the memory is not ready. The preceding surplus bit "1" is fed back from the register 74 to the input terminal $I_3$ of the shifter 71. The individual bits "1" and "0" of the 2-bit variable length code are applied to the input terminals $I_4$ and $I_3$ of the shifter 71. At this time, since the shift number is 2, the bits "1", "1", and "0" respectively at the terminals $I_3$ to $I_5$ are transferred to the output terminals $O_1$, $O_2$, and $O_3$ of the shifter 71 and then received into the register 74 (block 1 in S18 in FIG. 10). At time $t_2$, the data "110" received into the register 74 is transferred to the input terminals $I_7$, $I_6$, and $I_5$ of the shifter 72 (block 2 in S18). Also at the time $t_2$, a 4-bit data "0011" is fed via the signal line 140 to the shifter 71. At this time, since the shift number of the shifter 72 has a surplus number of 3 (the sum of the addition of the surplus 1 at the time $t_1$ and the code length 2 at the time $t_2$), the input terminals $I_7$ to $I_4$ of the shifter 72 are connected to the output terminals $O_4$ to $O_1$. Consequently, the data to be written in the memory at the time $t_2$ is a code "1100" which is the combination of the surplus code "110" at the time $t_1$ transferred (block 2 in S18) and the code of the first bit "0" (block 3 in S13) of the 4-bit data received at the time $t_2$. The remaining 3-bit code "011" (block 4 in S13 or dotted line block in S18) of the 4-bit data is received into the register 74 via the shifter 71. In this manner, the variable length code is arranged and, whenever accumulating to a unit block of four bits, it is written into the memory.

Generally, on the assumption that the largest number of parallel bits to be received is m and the number of parallel bits to be delivered out is l, the first shifter requires at least an cm+−1) bit input signal, a shift number of m, an and (−1) bit output signal. The second shifter 2 similarly requires a (2−1) bit input signal, a shift number of (l−1), and an l bit output signal. If these shifters are additionally provided with an (l−1)-bit register for the storage of surplus bits, an accumulator for counting the surplus bits, and a modulo l arithmetic circuit, then when a variable length code of 0 to m bits including an invalid code is received in various combinations of bits, the variable length code can be arranged and converted into a parallel data of bits devoid of the invalid code. This variable length code converter circuit, when the number l of parallel bits is so selected that the surplus bit will not overflow after accumulation (l=m is set when the code of the largest code length m occurs consecutively), permits generation of a variable length code arranged parallelly at the same sampling speed as that of the input data. For example, when m=12, l=12, and sampling speed=10 MHz, the variable coding can be implemented with a maximum of 120 Mb/S. Thus, this circuit is highly suitable for high-speed processing. The shifter is fundamentally a gate circuit for establishing the connection between the input lines and the output lines under designated conditions and, therefore, need not be limited to the aforementioned circuit device Am25S10.

The combination of V and R codes may be accomplished by various methods other than the method described so far. For example, the following rule may be adopted for the purpose of this combination. This will be called Rule 2.

(1) To a multi-level time series signal excepting that of the highest occurrence frequency level, the two types of codes, namely transition codes V* and non-transition codes V, are assigned. These codes are used on the principle that a V* code is allotted where the following signal is of the highest occurrence frequency level and a V code is allotted where the following signal is of a level other than the highest occurrence frequency level.

(2) For the signal of the highest occurrence frequency level, its run length is encoded and an R code is subject to the principle of (4) of the aforementioned Rule 1.

When the coding is carried out in accordance with this rule, the kind of V codes to be used will be more than twice that required in the coding effected by the aforementioned Rule 1. Nevertheless, Rule 2 is capable of enhancing the efficiency of data compression, though depending on the statistical nature of the multi-level time series signal involved in the operation. Of course, in this case, the optimization of variable length code to be assigned to each code constitutes the precondition.

As a modification to the aforementioned Rule 1, there may be available a method which comprises avoiding transmission of the last run length when the synchronizing codes up to the next synchronizing code are packed in one block or when a run length code occurs as the last of the codes contained in one block. This method can be effectively applied to both Rules 1 and 2 described above.

As described above, the encoder of the present invention has the following features:

(1) The compression is effected with high efficiency because the principle of run length coding is applied to the highest occurrence frequency level.

(2) The efficiency of compression is further enhanced because variable codes based on data information theory can be allotted to the V and R codes.

(3) No additional special codes indicating the status of transition are required because the V and R codes have level information of the signals and transition information of the codes.

(4) The number of V codes or R codes to be generated at one time on the time series can be limited to 1 or less and the generated V codes or R codes do not overlap on the time series. Thus, time-sharing multiplexing can easily be effected on the combination of V and R codes.

Because of these features, the present invention produces the following effects:

(a) The circuit required for the generation of codes of high compression efficiency can be simplified.

(b) The system as a whole can be simplified because both the R and V codes can be converted into compressed codes by the common variable bit arrangement converter circuit.

The invention has been described so far by way of example wherein the encoder is operated with a single multi-level time series signal. A plurality of time series signals may of course be applicable. For example, it is frequently practiced to have the two time series signals, i.e., a television signal and a voice signal, transmitted as multiplexed, or to have such signals transmitted with mode information necessary for individual blocks and information indicative of serial numbers of blocks multiplexed therewith. According to the invention, such information may be multiplexed by a multiplexing circuit on the parallel m-bit data lines before the arrangement conversion of the variable length code. In case where a plurality of time series signals are generated concurrently, however, another expedient is required for enabling such time series signals to be effectively subjected to time-sharing multiplexing.

Figure 8B:
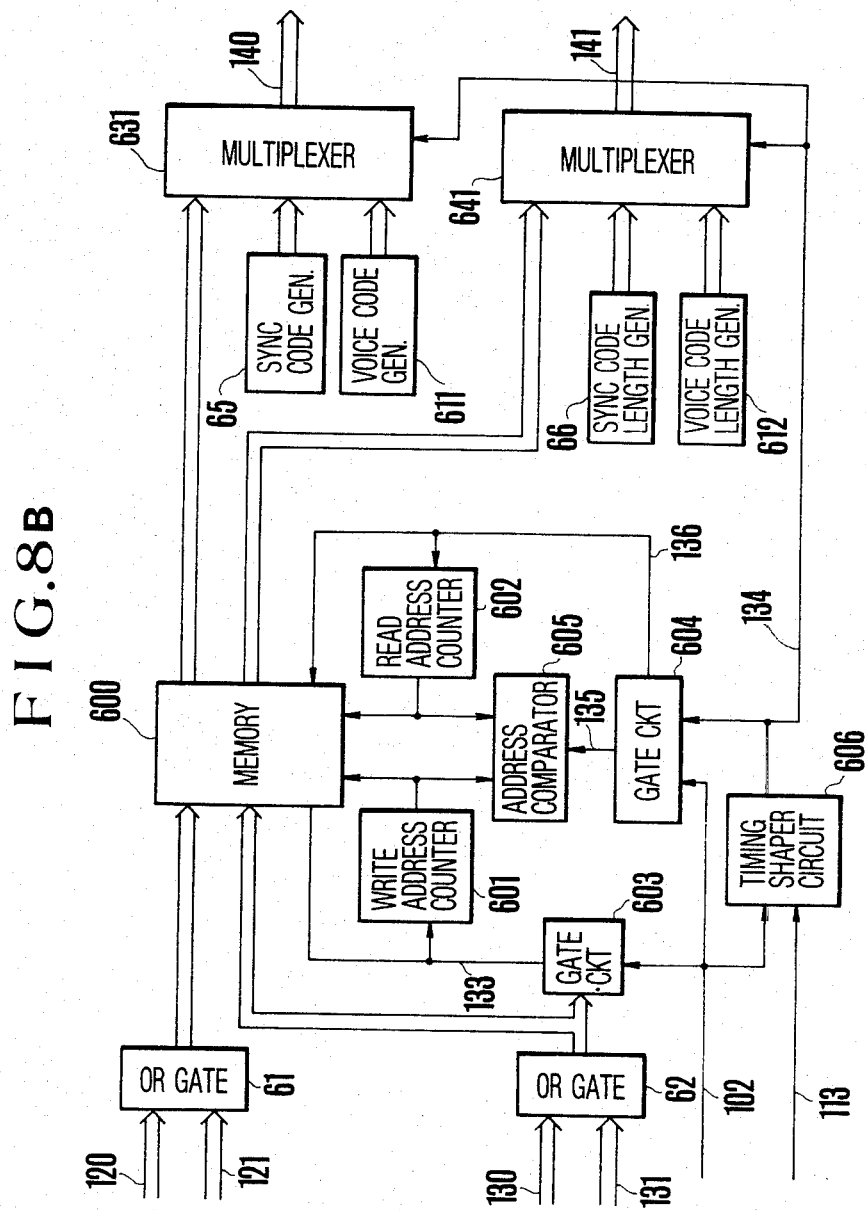
FIG. 8B is a block diagram illustrating another example of the multiplexer.

FIG. 8B illustrates an example of a multiplex circuit for multiplexing a plurality of time series data generated concurrently. FIG. 8B is a modification of the multiplex circuit of FIG. 8A. The V and R codes are fed via signal lines 120 and 121 and the code length signals respectively of the V and R codes are fed via signal lines 130 and 131. It is now assumed that data to be subjected to multiplexing is a 4-bit voice data generated at the time $t_1$ indicated in FIG. 2. Thus, the time at which the $V_1$ code is generated and the time at which the voice data is generated overlap, so that the multiplexing cannot be easily implemented. Referring to FIG. 2, no effective data are present at times $t_5$, $t_6$ and $t_{12}$. By utilizing these time slots, therefore, desired multiplexing of the voice data can be effected. Discernment of the positions for insertion of the voice data may be facilitated by inserting such voice data immediately after the synchronizing code S. What is then required to be done is to temporarily store the variable length code in a memory, thin out time slots corresponding to the code length of 0, and read out the stored code.

More specifically, in FIG. 8B, the variable length code and its corresponding code length signal multiplexed in the OR gates 61 and 62 are temporarily stored in a memory 600. A gate circuit 603 receives the code length signal and the sampling clock pulse 102 on the signal line produces a write pulse for the memory 600 on an output line 133 except when the code length is 0. The gate circuit 603 also feeds the write pulse for the memory 600 to a write address counter 601 to control the write address of the memory 600. A gate circuit 604 generates a read clock pulse on a signal line 136. This gate circuit 604 is controlled by the sampling clock pulse on line 102, a gate pulse on line 134 obtained by passing the synchronization timing signal on line 113 through a timing shaper circuit 606 and an address coincidence signal on line 135 issued from an address comparator 605. The read clock pulse is supplied to the memory 600 and, at the same time, to a read address counter, to effect control of the read address.

The control of the multiplexing is carried out as follows. First, the synchronizing code and the variable length code required for the extraction of the voice data are not read out of the memory 600 at the times $t_0$ and $t_1$. During this period, the codes generated from the synchronizig code generator 65 and a voice code generator 611 are delivered through a multiplexer 631 to the output line 140. The corresponding code length signal is issued to the output line 141 through a multiplexer 641. While the writing is suspended, the variable length code $V_1$ is written in the memory 600. The address comparator 605 compares the read address and the write address and conveys to the gate circuit 604 the information as to whether the memory 600 contains data to be read out. At the time $t_2$, the read stop gate is turned OFF and the variable length code $V_1$ is read out because the memory 600 contains data to be read out. By repeating this procedure, the time axis can be compressed by making use of the times at which the code length is 0. By utilizing this type of multiplex circuit, the code data can be subjected to time-sharing multiplexing even when a variable length code for the video data is generated at the time $t_0$ (namely, where there occurs no blanking). It goes without saying that no use is found for the memory circuit where blanking time occurs amply and the voice data can be multiplexed during the blanking period.

As described above, according to the FIG. 8B multiplex circuit, the variable bit arrangement converter circuit can be utilized in common for a plurality of series of codes because the plurality of series of codes to which code assignment has been made are subjected to time-sharing multiplexing on the parallel m-bit data lines and, thereafter, the variable bit arrangement conversion for the removal of invalid codes is effected by using signals indicative of the number of codes involved.

In the following description, a decoder will be described which is suitably used in combination with the encoder set forth hereinbefore.

Figure 11:
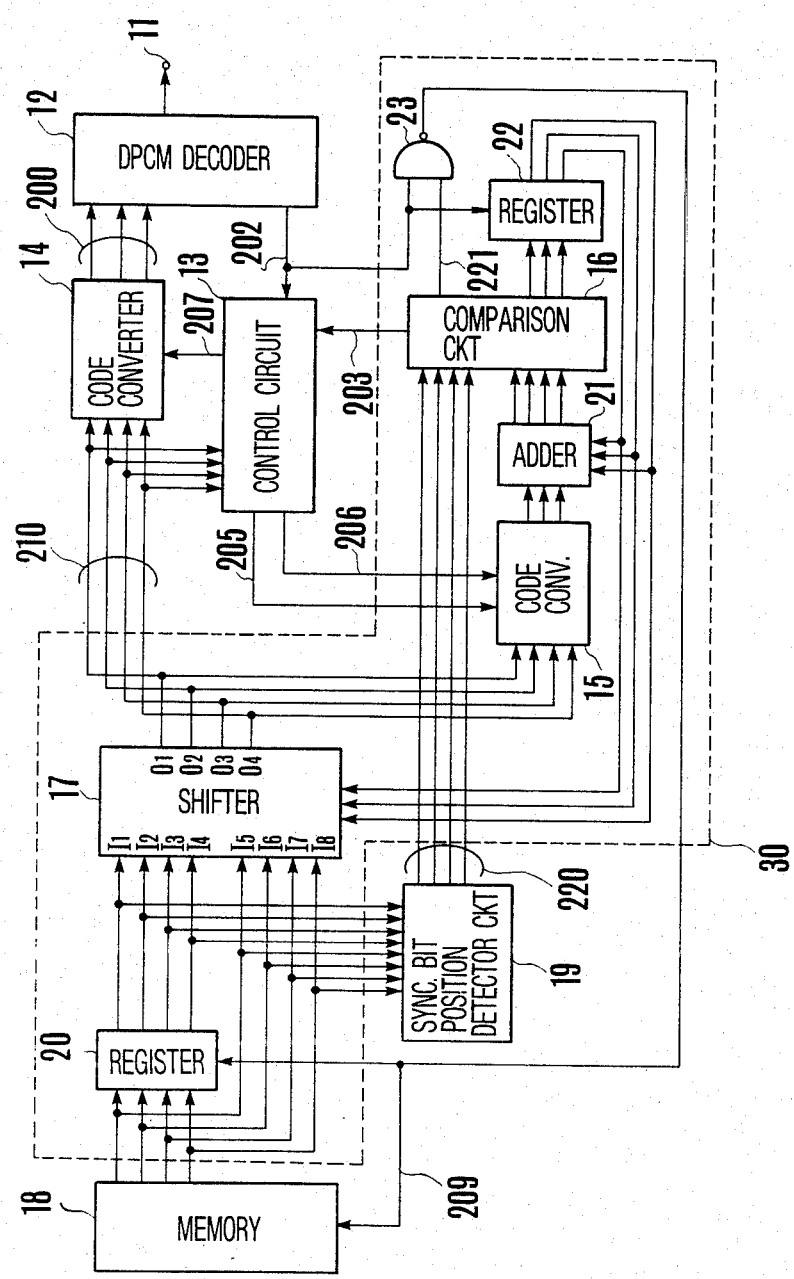
FIG. 11 is a block diagram illustrating a decoder used in the code conversion system embodying the invention.

Referring to FIG. 11, there is shown a preferred embodiment of a decoder adapted to reproduce the original television signal from the code which has been produced by the compression coding in the encoder of FIG. 2. The compressed code may either be transmitted to the decoder through a transmission path (not shown) or transferred to the decoder directly from the memory 18. In the case of the transmission through the transmission path, the memory 18 functions as a buffer memory to receive the incoming code for temporary storage and consecutively read it out in accordance with the progress of decoding. Since the data coming from the transmission path is generally in the form of 1-bit information, it is subjected to serial/parallel conversion and then written into the memory. The parallel 4-bit compressed code stored in the memory 18 is read out by means of a read clock pulse which is sent thereto via a signal line 209. The parallel 4-bit compressed code is divided by each of the variable length codes in a variable bit arrangement inverse converter circuit 30, and sent through a signal line 210 to a first code converter 14, so as to be converted into the original multi-level time series signal. To permit correspondence to FIG. 2, the embodiment of FIG. 11 involves use of a DPCM decoder 12. To be specific, the DPCM decoder 12 delivers the sampling clock pulse through a signal line 202 to the bit inversion circuit or the decoder and, by receiving from the first code converter 14 the original multi-level time series signal (differential signal) in synchronism with the sampling clock pulse, issues the original television signal to an output terminal 11. Here, the DPCM decoder 12 by no means imposes limitation on the present invention. Optionally, the sampling clock pulse may be generated within the decoder.

Referring to FIG. 11, the variable length code is subjected to the arrangement inversion in such a manner that the most significant bit of the inverted variable length code on the signal line 210 will constitute the first bit of the variable length code contained in each block. This arrangement inversion is effected by causing the 4-bit compressed data read out of the memory to be passed through a register 20 and a shifter 17. A second code converter 15 monitors the 4-bit code delivered to the shifter 17 and determines the code length of the variable length code. The code-length information thus obtained is fed to a shift number determining circuit for determining the next shift number for the shifter 17, which determining circuit includes an adder 21, a comparison circuit 16, and a register 22. A synchronizing bit position detecting circuit 19 serves to detect the synchronizing code S and decode the first bit position thereof. The control circuit 13 monitors the compressed code as to whether the compressed code is a V code, R code, or transition code and also controls the first and second code converters 14 and 15.

Figure 12:
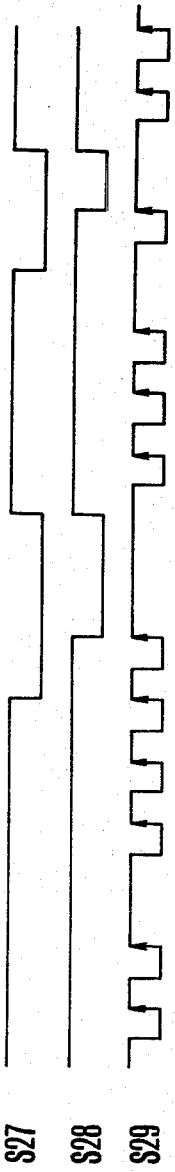
FIG. 12 is a diagram useful to explain the control timing for decoding.
Figures 13, 14:
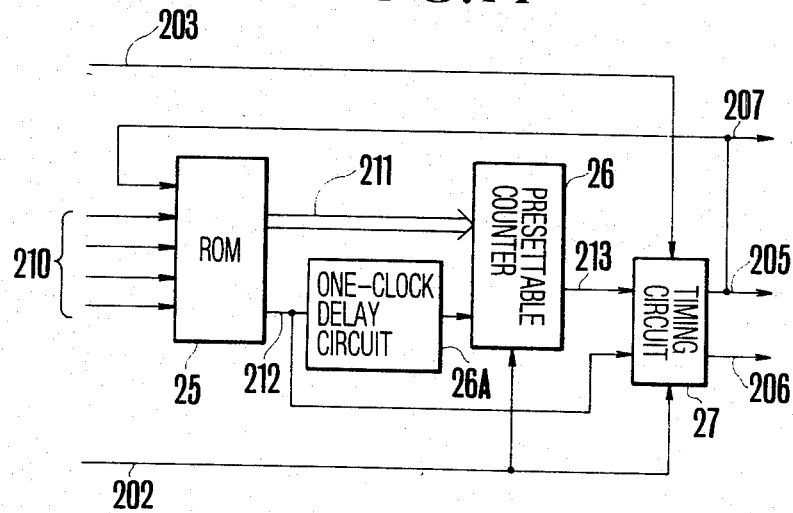
FIG. 13 is a diagram useful to explain the position of sync bit.
FIG. 14 is a block diagram illustrating an example of a control circuit used in the decoder.

Now, the operation of the decoder of this invention will be described in detail with reference to FIG. 12. Here, the compressed code is assumed to be similar to that indicated at S18 in FIG. 10 which has been encoded in accordance with Rule 1. In FIG. 12, S21 denotes series of time and S29 denotes a read block pulse for the memory 18, S22 denotes the code by binary notation in the order of its occurrence, which code is to be applied to input terminals $I_1$ to $I_8$ of the shifter 17. The parallel 4-bit code read out of the memory 18 is applied to the input terminals $I_5$ to $I_8$ of the shifter 17. The lower 4-bit code in S22 in FIG. 12, therefore, represents the code read out of the memory 18. The upper 4-bit code in S22 is the output from the register 20. The upper four bits represent a code obtained by sampling the lower four bits with the read clock pulse indicated by the signal S29, namely, a data read out of the memory 18 one clock before. It is now assumed that a code "0000" is read out at time $t_{-1}$ and a code "1100" at time $t_0$ respectively from the memory 18. The 8-bit code of the signal S22 is also supplied to the synchronizing bit position detecting circuit 19, wherein the synchronizing code S of the bit pattern "00001" is detected from the codes mentioned above. Consequently, this circuit 19 issues a synchronizing bit position signal Sp as illustrated in FIG. 13. If the 8-bit code contains the synchronizing code S, the synchronizing bit position signal Sp assumes a value of 0 when the synchronizing head bit falls on the most significant bit of the 8-bit code (appearing at the $I_1$ terminal of the shifter 17), a value of 1 when the head bit falls on the second bit, a value of 2 when the head bit falls on the third bit, and a value of 3 when the head bit falls on the fourth bit. Since the synchronizing code S is expressed with five bits, those four positions indicated above constitute the possible positions for synchronizing bits where the 8-bit code contains a synchronizing code. If the 8-bit code does not contain any synchronizing code S, the Sp takes a value of 15. Thus, the status of this Sp is the clue to the synchronizing bit position and the presence or absence of the synchronizing bit. Since the synchronizing code S is present at the time $t_0$ and the head bit position falls on the first of the eight bits, Sp=0 is satisfied. In FIG. 11, the Sp signal is delivered via a signal line 220 to the comparison circuit 16. The comparison circuit 16 compares a signal (r+n) (to be described later) indicative of the next code bit position supplied from the adder 21 with the Sp signal and, when (r+n)>Sp is satisfied, generates the residue of the division of (Sp+5) by 4 and a carrier signal. When (r+n)≦Sp is satisfied, it generates a surplus of the division of (r+n) by 4. And when (r+n)≧4, it generates the carrier signal. Since Sp=0 is satisfied and n≠0 is also satisfied as will be detailed later at the time $t_0$, there are generated a surplus of 1 and the carrier signal. The carrier signal is supplied via a signal line 221 to a NAND gate 23, and it gates the sampling clock pulse from the signal line 202 and produces the read clock pulse as the output. The code indicative of the surplus is delayed by one sampling clock in the register 22 and supplied to the shifter 17 as a shift number designating signal at the next time $t_1$. In FIG. 12, S24 shows the shift number r of the shifter 17. In the shifter 17, connection is established between the input terminal $I_1$ and the output terminal $O_1$, $I_2$ and $O_2$, $I_3$ and $O_3$, and $I_4$ and $O_4$ when the shift number is 0 and thus between the input terminal $I_{1+r}$ and the output terminal $O_1$, $I_{2+r}$ and $O_2$, ... when the shift number is r. At the time $t_1$, since a new data is read out of the memory 18, a code to be applied to the input terminals $I_1$ to $I_8$ of the shifter 17 is "11000110" as indicated at S22 in FIG. 12. Of the eight bits shown here, the first bit "1" corresponds to the fifth bit of the synchronizing code "00001" detected at the time $t_0$. The code of the first bit, therefore, is a used code, namely, a decoded code. The new code, accordingly, starts from the second bit. The shift number r supplied to the shifter 17 always indicates the starting position of such new code bits. In other words, the shift number is 0 when the starting position falls on the first bit and the shift number is 1 when the starting position falls on the second bit. Assuming that the number of undecoded bits stored in the register 20 is the number of surplus bits, the relation between the shift number r and the surplus bit number p will then be expressed as $p=4-r$. At the time $t_1$, since the shifter number r is 1, the code "1000" is produced at the output terminals $O_1$ to $O_4$ of the shifter 17. The second code converter 15 decodes the code length n of the variable length code from the variable length code at the terminals $O_1$ to $O_4$, converts the code length into a binary number, and delivers it to the adder 21. The code length n of the variable length code can easily be judged from the kind of code received (the distinction between V code and R code) and the code tables of FIG. 3 and FIG. 4. The distinction between V and R codes is effected by means of an RV signal (S27 in FIG. 12) supplied via a signal line 205 from the control circuit 13. To the control circuit 13, the synchronization detection signal is fed via a signal line 203 from the comparison circuit 16. On receiving this signal, the control circuit 13 effects delivery or initial setting of a signal indicating that the code at the time $t_1$ is a V code conforming to paragraph (5) of Rule 1. Referring to FIG. 3, since the $V_1$ code alone of all the V codes assumes the code pattern "10," the code length of the input code is found to be 2. The second code converter 15, therefore, produces the code length $n=2$. The adder 21 adds the code length $n=2$ and the shift number $r=1$ and supplies the sum of this addition $r+n=3$ to the comparison circuit 16. At the time $t_1$, since the synchronizing code S is not detected, $Sp=15$ is produced as the output. Since the relation between Sp and $(r+n)$ is $15 > 3$, a surplus of 3 resulting from the division of 3 by 4 is forwarded via the register 22 and used as the shift number for the next time $t_2$. At the time $t_1$, since the carrier signal is not produced, the read clock pulse is not generated. The code which has been used at the time $t_1$ is represented by two bits applied to the terminals $I_2$ and $I_3$ of the shifter 17. The remaining five bits still remain undecoded. Since the largest code length of the variable length code is of 4 bits, there is no need of reading out any new data from the memory 18 so far as four or more bits remain yet undecoded. At the time $t_2$, a signal "0011" which occurs when the input signal "11000110" is shifted by three bits is produced as the output at the output terminals $O_1$ to $O_4$ of the shifter 17. From FIG. 3, this signal is found to correspond to the $V_4$ code having a code length of 4. In FIG. 12, S23 represents the code length n of the variable length code, S24 the shift number r, S25 the sum $(n+r)$, and S26 the decoded code in sign. The codes enclosed with thick lines in S22 represent the variable length codes decoded at the indicated times. What should be specifically noted about this circuit operation is the fact that at the output terminal $O_1$ of the shifter 17, the head bit of a new variable length code is always produced as the output. The first code converter 14, therefore, converts the 4-bit code at the output terminals $O_1$ to $O_4$ of the shifter 17 into the original multi-level time series signal based on the RV signal and the table of FIG. 3, and delivers it to an output line 200. Of course, the output level for the R code is 0, which represents the highest occurrence frequency level. Since a $V_0^*$ code is decoded at time $t_4$ as illustrated in FIG. 12, an R code is decoded at the next time $t_5$. In this case, an $R_3^*$ code occurs at the time $t_5$. Detection of the $R_3^*$ code heralds consecutive occurrence of three of signals of zero level, indicating that the following variable length codes are not required to be decoded at the next times $t_6$ and $t_7$. The decoding operation is suspended temporarily. This suspension of the operation is controlled by the control circuit 13. In addition to generation of the RV signal as indicated at S27 in FIG. 12, the control circuit 13 supplies a gate signal as shown at S28 in FIG. 12 via a signal line 206 to the second code converter 15. The gate signal indicates the period in which the decoding operation is suspended. As the gate signal reaches a low level, the second code converter 15 forcibly zeros the code length n. In this manner, the variable length code is sequentially decoded. At the time $t_{14}$, the synchronizing code is again detected and the circuit operation is returned to its initial state. The first and second code converters of FIG. 11 can easily be realized by a read only memory (ROM).

FIG. 14 is a diagram illustrating an example of the control circuit 13. The output from the shifter 17 is fed via the signal line 210 to the address input terminals of a ROM 25. On detecting the $V_0^*$ code, the ROM 25 delivers the $V_0^*$ detection signal as the output to a signal line 212. In the case of R code, the ROM 25 produces a binary code indicative of the run length as the output to a signal line 211. The $V_0^*$ detection signal is fed through a timing circuit 27 containing a flipflop and a one-clock delay circuit 26A and applied to a load terminal of a presettable counter 26. Consequently, the run length is loaded in the counter. The counter 26 performs a countdown operation one at a time per clock. When the time equivalent to the run length loaded in the counter elapses, therefore, the counter delivers the carrier signal via a signal line 213 to the timing circuit 27. The timing circuit 27 produces the RV signal from the $V_0^*$ detection signal and sends it as the output to the signal line 205 and, at the same time, reverses the RV signal by means of the carrier signal with the aid of an internal flipflop. In FIG. 14, the sampling clock pulse is fed via the signal line 202 and the synchronization timing pulse is fed via the signal line 203. The synchronization timing pulse is used for determining the initial condition of the RV signal applied to the circuit 27.

The variable bit arrangement inverse converter circuit 30 functions to convert the arrangement of the compressed variable length code and deliver the separated variable length codes one by one to the output signal line 210 as already described above. In other words, the first bit of the variable length code is always entered in the most significant bit on the output line 210. The control circuit 13 doubly functions to designate the kind of code in accordance with the rule for code conversion and to control the time of decoding and does not impose a particular restriction on the variable bit arrangement inversion circuit 30. For example, no use is found for the control circuit 13 where the variable length code is formed exclusively of the V code. The variable length code arrangement inverse converter circuit 30 illustrated here is a circuit specially designed to effect arrangement conversation on the parallelly received compressed variable length code and separate it into component variable length codes. This circuit is characterized by its ability to operate at a high speed. Let m stand for the largest code length of the variable length code and l stand for the number of parallel bits, and the construction of this circuit may be generalized as follows. The register 20 is required to permit temporary storage of at least (l−1) bits of the data, and the shifter 17 is required to receive the input signal of at least (m+l−1) bits, to produce the output signal of m bits, and have the shift number of at least (l−1). For control of the shift number of the shifter, the control circuit also requires an arithmetic circuit capable of decoding the code length of variable length code and generating as the output the surplus of the division of the sum of the code length and the present shift number by l and the carrier signal, a circuit for delivering this surplus as the shift number to the shifter via the register, and a circuit for requesting read out of the memory in accordance with the carrier signal. For detection of the initial condition of the variable length code, in the case of the synchronizing code being inserted, the control circuit further requires a circuit which is adapted to issue signals indicating the presence/absence of the synchronizing signal and the position of the synchronizing bit and compare the position of bit in decoding with the position of the synchronizing bit to thereby set the initial condition. Where the parallel bit number l is 12 and the clock frequency is 10 MHz, the decoder has a capacity for decoding up to 120 Mb/s of variable length code. As described previously, when the variable bit arrangement inversion circuit incorporates a control circuit capable of controlling the kind of variable length code and also controlling the time for decoding, it is possible to decode variable length codes formed in accordance with various rules.

Figure 15:
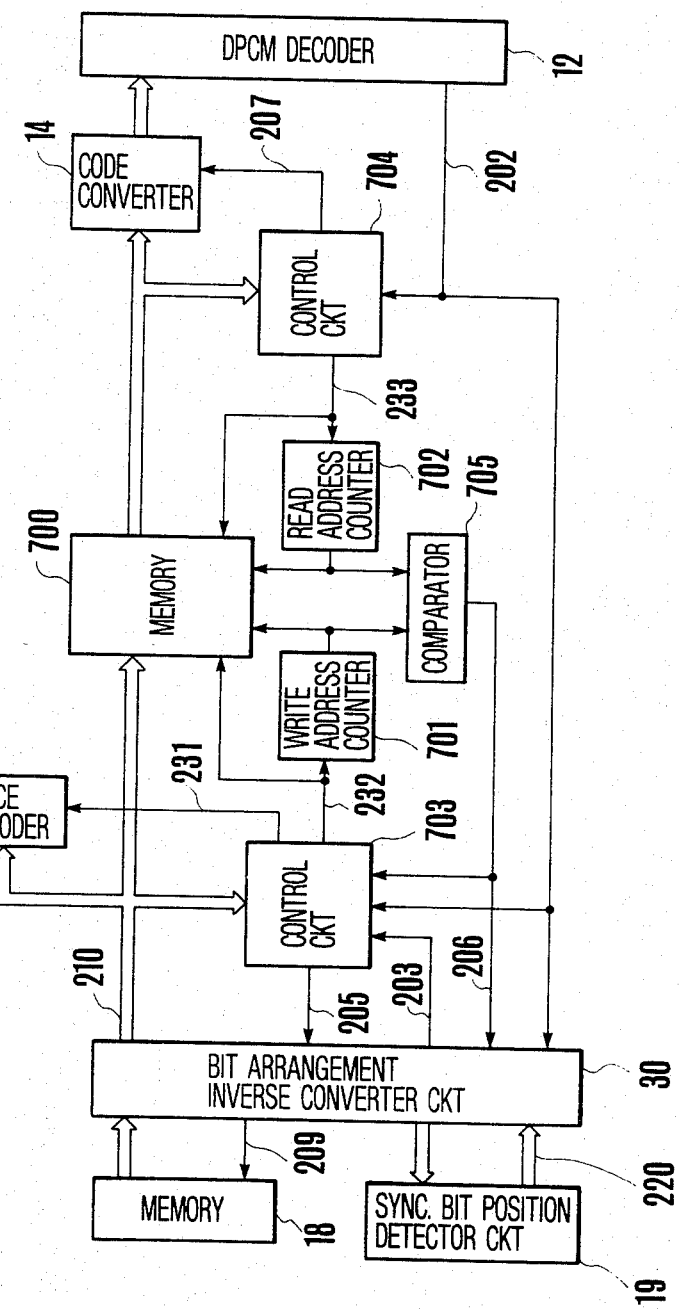
FIG. 15 is a block diagram illustrating another example of the decoder.

FIG. 15 illustrates another embodiment of a decoder as applied for decoding a plurality of multi-level time series signals multiplexed in the form of compressed codes within one block. The embodiment illustrated represents a case wherein the compressed coding is carried out, as shown in the case of FIG. 8B, with respect to the two time series signals, i.e. a television signal and a voice signal. The construction of FIG. 15, though fundamentally the same as that of FIG. 11, incorporates into the control circuit of FIG. 11 an additional function to adjust the reproduction time for the television signal and the voice signal. Referring to FIG. 15, parallel l-bit compressed code is read out of the memory 18 by means of the read clock pulse fed via the signal line 209, and the variable length code is separated in the variable bit arrangement inverse conversion circuit 30 and rearranged to produce an output code on the signal line 210 in such a manner that the first bit of the variable length code appears on the most significant bit line of the output signal line 210. The synchronizing bit position detecting circuit 19 is connected to the variable bit arrangement inverse converter circuit 30. These component elements 18, 19, and 30 operate exactly in the same way as the corresponding elements of FIG. 11. The signal line 210 is connected to a first control circuit 703, a voice decoder 706, and a memory 700. The first control circuit decodes the code delivered on the signal line 210, produces an RV signal on the signal line 205 and, at the same time, produces a data write pulse for the memory 700 on a signal line 232 and an audio data timing pulse on a signal line 231. Since the voice data is inserted subsequent to the synchronizing code, it can be readily produced from the synchronization timing pulse on the signal line 203. The memory data write pulse on the signal line 232 is also supplied to a write address counter 701 to effect control of the write address. In the memory 700, video data is exclusively written, excluding voice data. Therefore, reproduction of the original television signal can be effected by sequentially reading out the data contained in the memory 700 under the control of the second control circuit 704, converting the variable length code into the original multi-level time series data by the first code converter 14, and supplying the obtained data to the DPCM decoder 12. A second control circuit 704, on reception of the run length code, causes temporary suspension of the memory read pulse on signal line 233 during the continuation of the highest occurrence frequency level, feeds the RV signals on signal line 207 to the first code converter, and sets to the highest occurrence frequency level the time series data reproduced during this period. The memory read clock pulse on signal line 233 is also supplied to the read address counter 702 to effect control of the read address. The memory read address and the write address are compared in a comparator 705. When the memory is filled to capacity, the decode stop signal is forwarded through the signal line 206 to the variable bit arrangement inverse converter circuit 30 and the first control circuit 703.

In the construction of FIG. 15, since the data indicative of the television signal is stored separately in the memory 700, the original multi-level time series data corresponding to the television signal can be decoded irrespective of the presence of other multiplexed information. Onto the signal line 210, all the multiplexed codes are delivered as separated one from another. Since entry of data into the memory 700 does not occur while the codes other than the video signal is being decoded, the data previously written in the memory are digested during this period. Thus, the memory is only required to possess a capacity enough to admit substantially the number of multiplexed data other than the video data.

In the manner described above, the decoder of this embodiment permits easy decoding of the compressed codes produced by multiplexing a plurality of multi-level time series signals including the voice signal or mode signal in addition to the video signal.

The decoder of this embodiment has the following features:

(1) The decoder enjoys high operational speed and notable simplicity of circuit configuration because the arrangement inversion of the variable length code is effected by causing compressed data read out in parallel l-bit pattern to be converted into the separated parallel m'-bit variable length code.

(2) The decoder imposes no restriction on the kind of synchronizing code and enjoys flexibility because detection of the synchronizing code for the determination of the initial condition of the operation of arrangement inversion is effected with respect to the read-out parallel data to detect the bit position beginning the synchronizing code.

(3) The decoder permits simplification of the whole circuit configuration because the variable bit arrangement inverse converter circuit can be used in common to a plurality of multiplexed multi-level time series signals.

What is claimed is:

1. In a code conversion system comprising an encoder, said encoder comprising an input terminal for receiving a multi-level time series signal having at least three signal levels subject to a variation of occurrence frequency of signal levels, means for detecting the highest occurrence frequency signal ("HOFS") level of said multi-level time series signal and generating a first code representative of the run-lengths of said HOFS level; means for generating a second code representative of the signal levels of said multi-level time series signal where the first code and second code, each include at least one first and second transition code respectively, wherein occurrences of the first transition code indicate transitions from the first code to the second code and occurences of the second transition code indicate transitions from the second code to the first code, and means for combining said codes from said first and second code generation means on the time series so as to produce a coded signal containing said first and second codes in combination.

2. A code conversion system according to claim 1 wherein said first code generating means comprises a first memory for storage of the first code, and said second code generating means comprises a second memory for storage of the second code, said first and second memories being addressed by said signal levels and run-lengths under the control of a level code generation timing pulse and a run-length code generation timing pulse generated from a timing control circuit based on the highest occurrence frequency signal level detected so that said first and second codes are read out of said first and second memories.

3. In an encoder in which at least one multi-level time series signal having at least three signal levels is divided into unit blocks on the time series and compressed coding is effected on the signals in the individual unit blocks, the improvement which comprises means for generating a synchronizing code indicative of boundaries of said blocks, means for detecting the highest occurence frequency signal (HOFS) level in said multi-level time series signal and for generating a first code indicative of the run-lengths of said HOFS level, means for generating a second code indicative of the individual levels of the multi-level signal, means for time-sharing a multiplexing and synchronizing code and said first and second codes on parallel m-bit, m denoting an interger of 2 or more, data lines, means for generating a signal indicative of the bit number of valid or invalid codes on said parallel data lines, and a variable bit arrangement construction for eliminating invalid bits on said parallel m-bit data lines by means of said bit number indicating signal so as to arrange only valid bits onto the parallel l-bit, l denoting an optional integer, data lines in a predetermined order using a parallel to parallel conversion process.

4. In a code conversion system comprising an encoder and a decoder in combination, said encoder comprising an input terminal for receiving a multi-level time series signal having at least three signal levels subject to a variation of occurrence frequency of signal levels means for detecting the highest occurrence frequency signal ("HOFS") level of said multi-level time series signal and generating a first code representative of the run-lengths of said HOFS level; and, means for generating a second code representative of the signal levels of said multi-level time series signal where the first code and second code each include at least one first and second transition code respectively, wherein occurrences of the first transition code indicate transitions from the first code to the second code and occurrences of the second transition code indicate transitions from the second code to the first code, and means for combining said codes from said first and second code generation means on the time series so as to produce a coded signal containing said first and second codes in combination, said decoder comprising means for separating said first and second codes from said coded signal, and means for decoding the separate first and second codes into the original multi-level time series signal.

5. In the system of claim 3 a decoder for reproducing variable length codes from compressed data divided into blocks, the improvement which comprises a memory for temporary storage of said compressed data, a synchronizing bit position detecting circuit for reading said compressed data from said memory onto parallel l-bit, l denoting an integer of 2 or more, data lines, detecting the presence or absence of a synchronizing code indicative of the boundaries of said blocks on said parallel data lines, and detecting the bit position of said synchronizing code, a variable bit arrangement inverse converter circuit being set in its initial state in response to the signal from said synchronizing bit position detecting circuit, for detecting the code length of the variable length code from the parallel data, and separating the variable length code from the parallel data by use of the code length detection signal using a parallel to parallel conversion process, and means for converting said separated variable length code into said at least one multi-level time series signal having at least three levels.

6. A code conversion system according to claim 1 wherein individual codes in said first code are defined with presence or absence of the transitions from the first code to the second code and individual codes in said second code are defined with presence or absence of the transitions from the second code to the first code.

* * * * *